United States Patent [19]
Hayata

[11] Patent Number: 6,055,039
[45] Date of Patent: *Apr. 25, 2000

[54] ILLUMINATION SYSTEM AND EXPOSURE APPARATUS USING THE SAME

[75] Inventor: Shigeru Hayata, Utsunomiya, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/711,307

[22] Filed: Sep. 3, 1996

Related U.S. Application Data

[63] Continuation of application No. 08/265,030, Jun. 24, 1994, abandoned.

[30] Foreign Application Priority Data

Jun. 29, 1993 [JP] Japan .................................. 5-159057
Jun. 29, 1993 [JP] Japan .................................. 5-159058

[51] Int. Cl.$^7$ ............................ G03B 27/54; G03B 27/42
[52] U.S. Cl. ............................................. 355/67; 355/53

[56] References Cited

U.S. PATENT DOCUMENTS

| | | | |
|---|---|---|---|
| 4,497,013 | 1/1985 | Ohta | 362/32 |
| 4,682,885 | 7/1987 | Torigoe | 355/67 |
| 5,091,744 | 2/1992 | Omata | 355/53 |
| 5,153,773 | 10/1992 | Muraki et al. | 359/619 |
| 5,218,660 | 6/1993 | Omata | 385/116 |
| 5,263,250 | 11/1993 | Nishiwaki et al. | 29/890.1 |
| 5,305,054 | 4/1994 | Sizuki et al. | 355/53 |
| 5,379,090 | 1/1995 | Shiraishi | 355/67 |

FOREIGN PATENT DOCUMENTS

| | | |
|---|---|---|
| 62-2540 | 1/1987 | Japan . |
| 62-115718 | 5/1987 | Japan . |
| 62-115719 | 5/1987 | Japan . |
| 5-45605 | 2/1993 | Japan . |

*Primary Examiner*—Safet Metjahic
*Assistant Examiner*—Michael Dalakis
*Attorney, Agent, or Firm*—Fitzpatrick, Cella, Harper & Scinto

[57] ABSTRACT

An illumination system includes a fly's eye lens including lens elements each having an approximately oblong shape in section perpendicular to an optical axis of the illumination system, and an optical system for separating light from a light source into plural lights and for directing the plural lights toward the fly's eye lens along different directions. The optical system is arranged so that paths of the plural lights are juxtaposed along a lengthwise direction of the oblong shapes. A device manufacturing method includes transferring a device pattern of a mask onto a workpiece using such an illumination system.

64 Claims, 12 Drawing Sheets

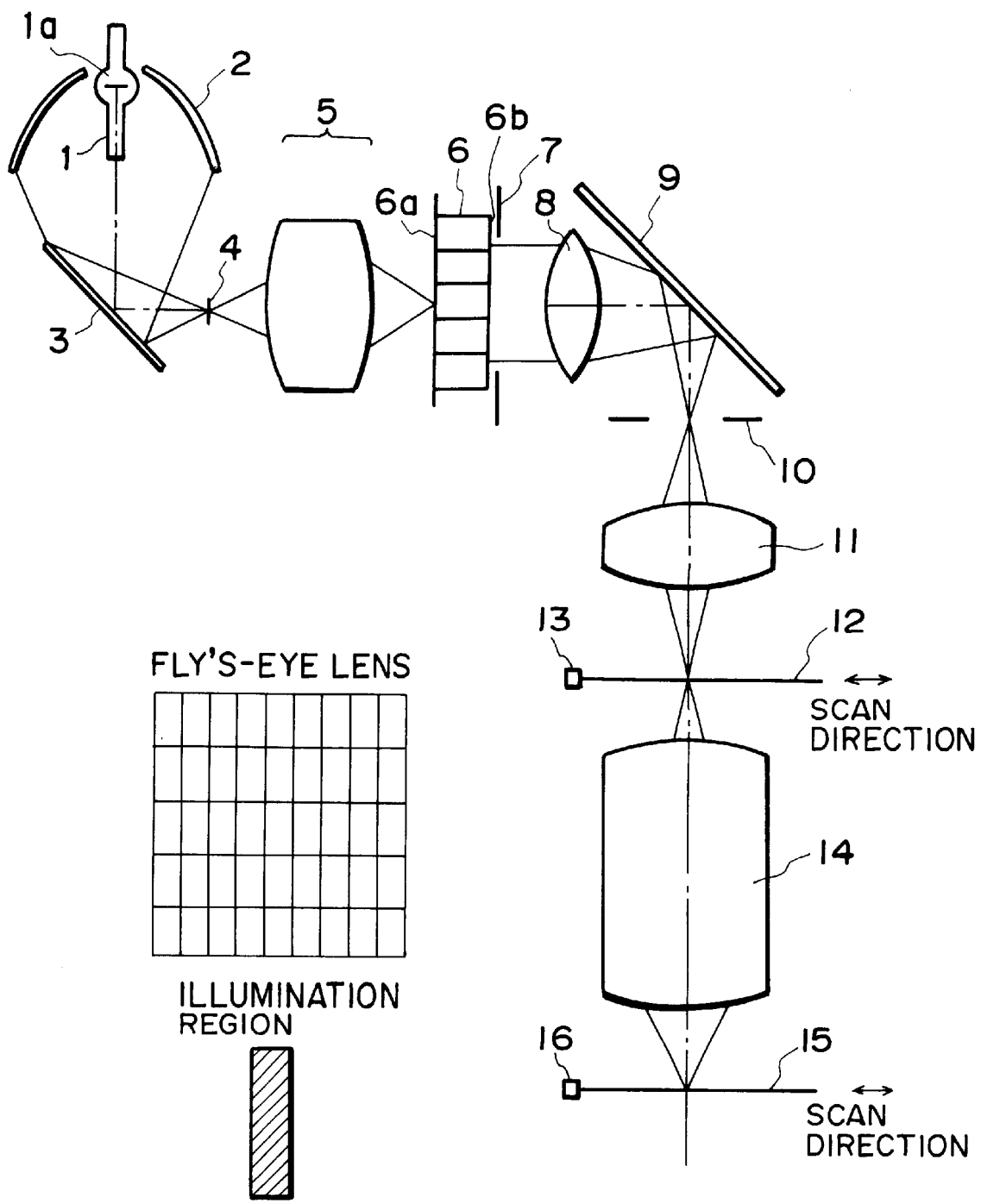
F I G. 1

DIRECTION OF
EXITING LIGHT

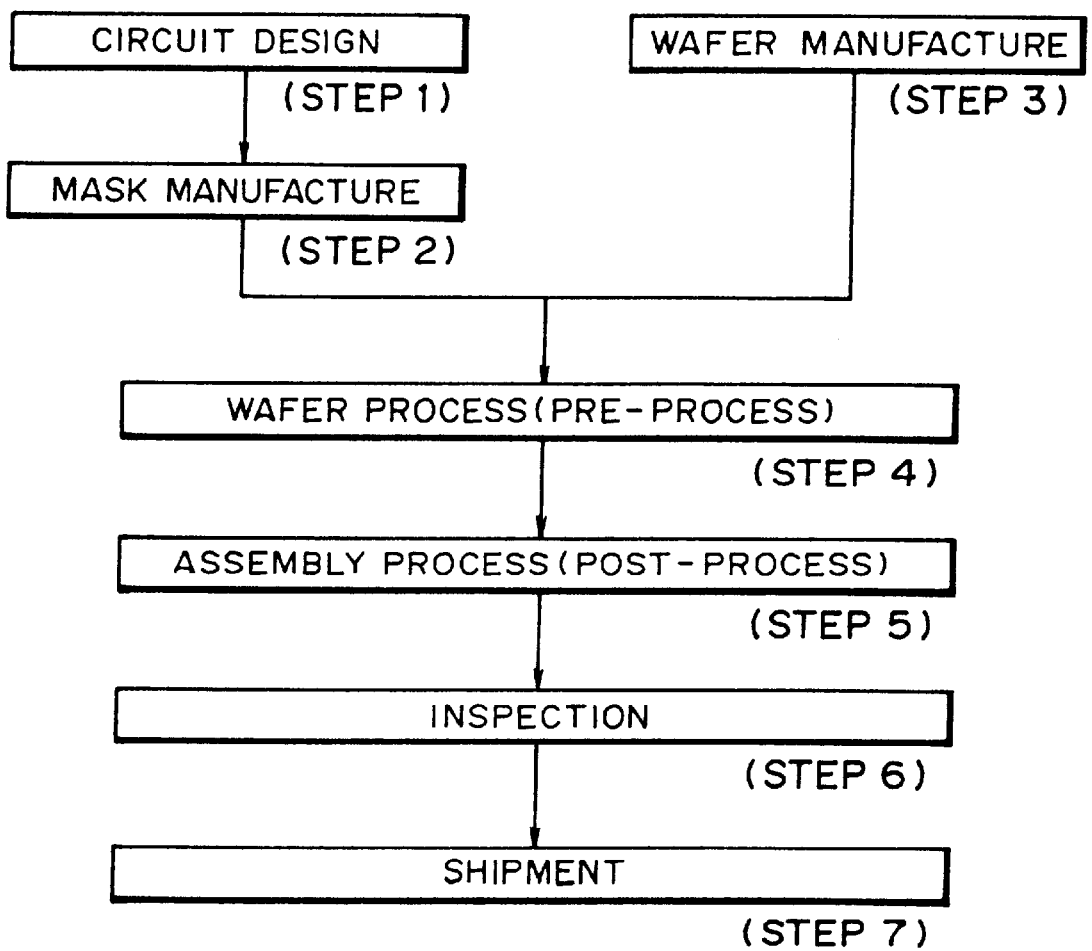
F I G. 14

ILLUMINATION SYSTEM AND EXPOSURE APPARATUS USING THE SAME

This application is a continuation of application Ser. No. 08/265,030, filed Jun. 24, 1994, now abandoned.

FIELD OF THE INVENTION AND RELATED ART

This invention relates to an illumination system and an exposure apparatus using the same. More particularly, the invention is concerned with an illumination system and an exposure apparatus using the same, suitably usable for manufacture of microdevices such as semiconductor devices (such as ICs or LSIs), image pickup devices (such as CCDs), liquid crystal panels or magnetic heads, for example.

FIG. 1 is a schematic view of an example of a scanning type projection exposure apparatus. In FIG. 1, denoted at 1 is a light source such as a Hg lamp or Xe-Hg lamp, for example, for producing ultraviolet light. Denoted at 1a is a light emitting portion (electrode) of the lamp. Denoted at 2 is an elliptical mirror, and the light emitting portion 1a of the light source 1 is disposed close to the first focal point of the elliptical mirror. The elliptical mirror 2 serves to image the light emitting portion 1a on its second focal point 4. Denoted at 3 is a cold mirror for reflecting ultraviolet rays but transmitting infrared rays.

The light from the image of the light emitting portion 1a, formed at the second focal point 4 of the elliptical mirror 2, is collected by a condenser lens 5 onto the light entrance surface of an optical integrator provided by a fly's eye lens 6. The fly's eye lens 6 comprises a combination of a number of small lenses. Denoted at 7 is an aperture stop.

In this illumination system, a reticle 12 is illuminated with slit-like light having an oblong sectional shape, and an illumination region of oblong shape is defined on the reticle 12. In this connection, each of the small lenses of the fly's eye lens has an oblong sectional shape analogous to the shape of the illumination region.

Denoted at 11 is a condenser lens, and denoted at 10 is a masking blade means which defines a field stop. The reticle 12 is disposed at a position optically conjugate with the masking blade means 10. Denoted at 14 is a projection optical system which comprises a dioptric system or a cata-dioptric system, for example. Denoted at 15 is a wafer, the wafer and the reticle 12 being placed in an optically conjugate relationship with each other with respect to the projection optical system 14. Denoted at 13 and 16 are driving devices for moving the reticle 12 and the wafer 15, respectively, in the scanning direction as denoted by arrows. The reticle 12 and the wafer 15 are scanned with slit-like light while being moved by the driving devices 13 and 16, respectively.

In the illumination system of this example, since each small lens of the fly's eye lens 6 has an oblong sectional shape, an effective light source (secondary light source) defined by the fly's eye lens 6 has an intensity distribution such as shown in FIG. 2, wherein distribution of illuminance (intensity) differs between that in the X direction and in the Y direction of FIG. 2. This leads to the quality of the image to be formed on the wafer 15 becoming uneven between that in the X direction and in the Y direction. In other words, the image quality is lower with respect to one direction than in the other direction.

It is to be noted that this effective light source comprises a combination of images of apertures of the elliptical mirror as can be observed through the small lenses constituting the fly's eye lens 6.

SUMMARY OF THE INVENTION

It is an object of the present invention to provide an illumination system or an exposure apparatus by which the image quality can be improved.

In accordance with an aspect of the present invention, there is provided an illumination system, comprising: a fly's eye element having a plurality of elements of substantially oblong sectional shape disposed two-dimensionally; and light projecting means for projecting, to said fly's eye element, a plurality of lights arrayed along a longer side of said element.

In accordance with another aspect of the present invention, there is provided an exposure apparatus, comprising: a fly's eye element having a plurality of elements of substantially oblong sectional shape disposed two-dimensionally; and light projecting means for projecting, to said fly's eye element, a plurality of lights arrayed along a longer side of said element.

In an illumination system or an exposure apparatus according to one of these aspects of the present invention, the provision of the light projecting means as described assures formation of an image whose quality can be held substantially even in any direction, thus improving the image quality.

In a preferred form of such an illumination system or exposure apparatus of the present invention, the light projecting means divides light from a light source to provide the plurality of lights, and the light projecting means projects the plurality of lights upon each element of substantially oblong shape at an incidence angle which satisfies a relation θa>θbc, where θa is a maximum angle defined between an optical axis and a light ray impinging on the element, in a section taken along a plane parallel to the longer side of the element and including the optical axis, and where θbc is a maximum angle defined between the optical axis and a light ray to be transmitted by the element, in a section taken along a plane parallel to a shorter side of the element and including the optical axis.

In accordance with a further aspect of the present invention, there is provided an illumination system, comprising: a fly's eye element having a plurality of elements of substantially oblong sectional shape disposed two-dimensionally; and light projecting means for projecting, to said fly's eye element, light from a plurality of light source images arrayed along a longer side of said element.

In accordance with a still further aspect of the present invention, there is provided an exposure apparatus, comprising: a fly's eye element having a plurality of elements of substantially oblong sectional shape disposed two-dimensionally; and light projecting means for projecting, to said fly's eye element, light from a plurality of light source images arrayed along a longer side of said element.

In an illumination system or an exposure apparatus according to one of these aspects of the present invention, the provision of the light projecting means as described assures formation of an image whose quality can be held substantially even in any direction, thus improving the image quality.

In one preferred form of such an illumination system or exposure apparatus of the present invention, the light projecting means includes a lamp having plural light emitting portions, and an elliptical mirror for reflecting and collecting light from the lamp to define images of the plural light emitting portions.

In another preferred form of such an illumination system or exposure apparatus of the present invention, the light projecting means includes plural lamps and plural elliptical mirrors for reflecting and collecting light from the lamps to define images of light emitting portions of the lamps.

In a further preferred form of such an illumination system or exposure apparatus of the present invention, the light projecting means includes plural lamps and a single elliptical mirror for reflecting and collecting light from the lamps to define images of light emitting portions of the lamps.

In a still further preferred form of such an illumination system or exposure apparatus of the present invention, a projection optical system is provided for imaging a pattern of a mask on a substrate.

With an exposure apparatus according to any of the aspects of the present invention described above, it is possible to produce devices such as semiconductor devices (e.g. ICs or LSIs), image pickup devices (e.g. CCDs), liquid crystal panels or magnetic heads, for example, accurately.

In an illumination system or an exposure apparatus according to any one of the aspects of the present invention described above, each element may comprise a lens.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view of an example of a scanning type exposure apparatus.

FIG. 14 is a flow chart of semiconductor device manufacturing processes.

DESCRIPTION OF THE PREFERRED EMBODIMENTS

Figure 3:
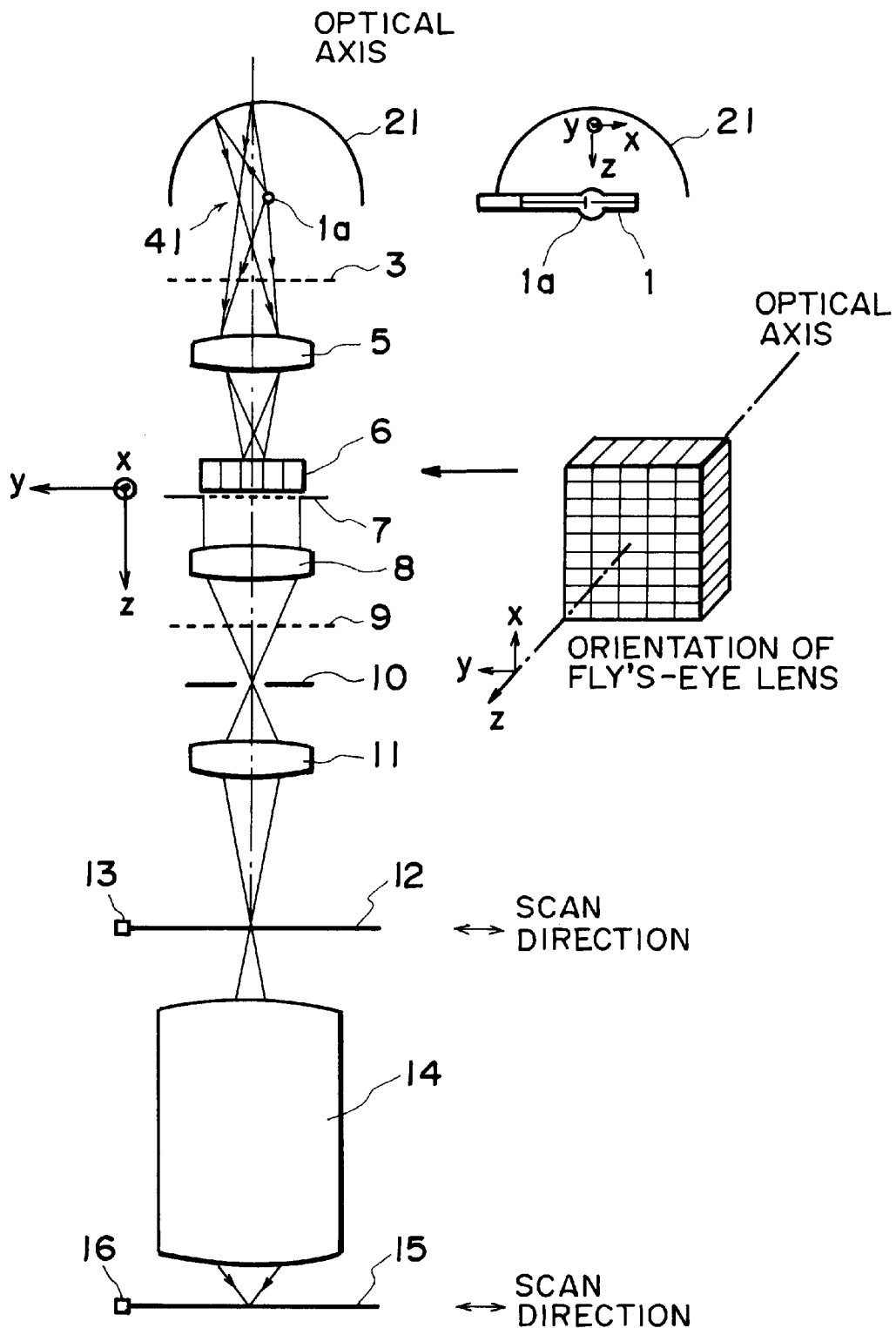
FIG. 3 is a schematic view of an illumination system according to a first embodiment of the present invention.

FIG. 3 is a schematic view of an embodiment of the present invention, and it shows a scanning type projection exposure apparatus for the manufacture of devices such as semiconductor devices (e.g. ICs and LSIs), image pickup devices (e.g. CCDs), liquid crystal panels or magnetic heads, for example.

In FIG. 3, for simplicity of illustration, a deflecting mirror and a cold mirror such as shown in FIG. 1 are not illustrated, but they may be disposed at the positions depicted by broken lines, respectively.

In FIG. 3, denoted at 1 is a light source such as a Hg lamp or Xe-Hg lamp, for example, for producing ultraviolet rays. Denoted at 1a is a light emitting portion (electrode) thereof. Denoted at 21 is a spherical mirror. The light emitting portion 1a of the light source 1 is disposed at a position slightly deviated from the curvature center of the spherical mirror 2, along a direction orthogonal to the optical axis, and the spherical mirror 21 serves to image the light emitting portion 1a on its focal point 41. Thus, in this system, two light sources, that is, one light source provided by the light emitting portion 1a and one light source provided by the image of the light source 1a, are defined at opposite sides of the optical axis.

The light from the two light sources, i.e., from the light emitting portion 1a and from the focal point 41 (image of the light emitting portion 1a), is collected by a condenser lens 5 onto the light entrance surface of an optical integrator which comprises a fly's eye lens 6. Denoted at 7 is an ordinary aperture stop. It may be replaced by a special stop for ring-like zone illumination or quadruple illumination.

In this embodiment, a reticle 12 is illuminated with slit-like light having an oblong sectional shape, and an illumination region of oblong shape is defined on the reticle 12. Thus, each small lens of the fly's eye lens 6 has an oblong sectional shape which is analogous to the shape of the illumination region (see FIG. 3). Usually, a fly's eye lens comprises a combination of spherical lenses. However, it may comprise a combination of cylindrical lenses or toric lenses, for example.

Denoted at 8 and 11 are condenser lenses, and denoted at 10 is a masking blade means. The reticle 12 is placed at a position optically conjugate with the masking blade means 10. Denoted at 14 is a projection optical system which comprises a dioptric system or cata-dioptric system, for example. Denoted at 15 is a wafer, the reticle 12 and the wafer 15 being placed in an optically conjugate relationship with each other with respect to the projection optical system 14. Denoted at 13 and 16 are driving devices for moving the reticle 12 and the wafer 15, respectively, in the scanning direction as depicted by arrows. The reticle 12 and the wafer 15 are scanned with slit-like light, while being moved by the driving devices 13 and 16, respectively.

Figure 4:
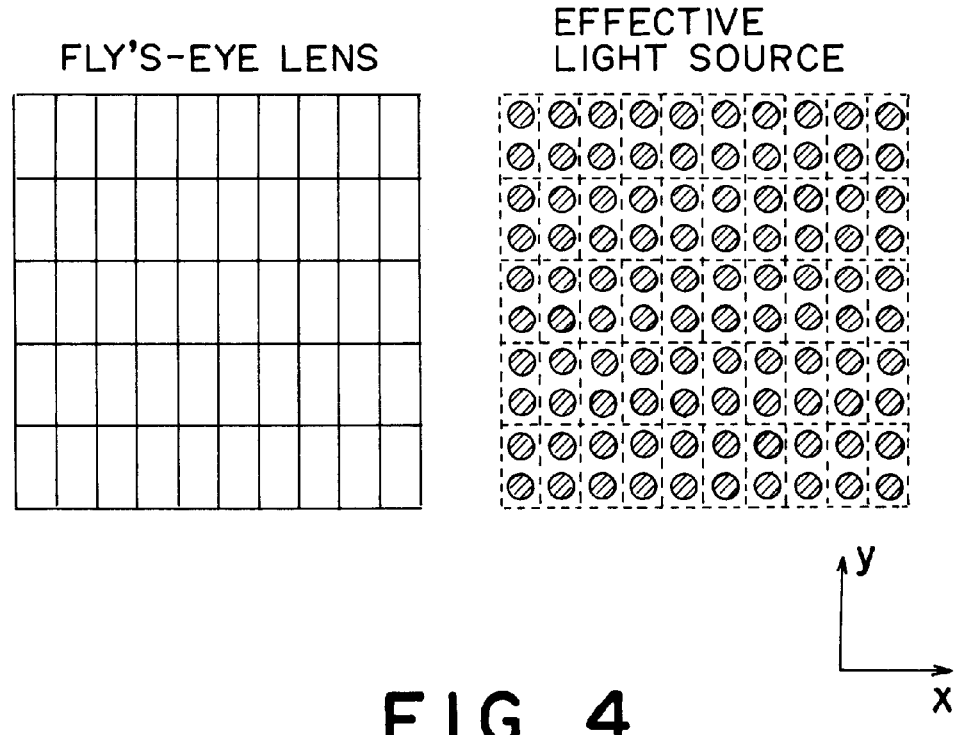
FIG. 4 is a schematic view for explaining a fly's eye lens and a light intensity distribution of an effective light source in the illumination system of the FIG. 3 embodiment.

In this embodiment, the fly's eye lens 6 comprises small lenses each having an oblong sectional shape. The direction of a major side (longer side) of each small lens corresponds to the direction of an array of the light emitting portion 1a and the focal point 41 (image of the light emitting portion 1a), and thus the fly's eye lens is illuminated with two lights from the light emitting portion 1a and the focal point 41, respectively, in directions different from each other. As a result, the effective light source produced by the fly's eye lens 6 has such an intensity distribution as shown in FIG. 4, wherein a pair of light sources are defined by each small lens. Thus, as compared with the effective light source having been described with reference to FIG. 2, there is only a small difference in intensity distribution between that in the X direction and in the Y direction.

From FIG. 3, the relationship between the orientation of the lamp 1 and the spherical mirror 21 and the direction of a longer side of each small lens of the fly's eye lens 6 is clear.

Figure 2:
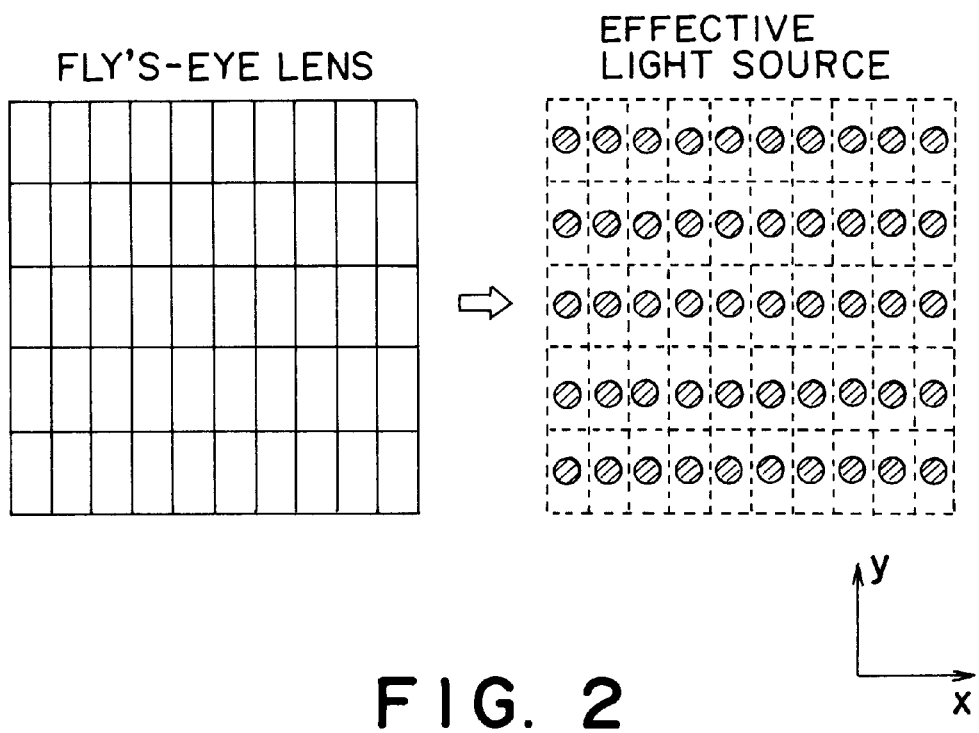
FIG. 2 is a schematic view for explaining a fly's eye lens and an intensity distribution of an effective light source in the example of FIG. 1.

The effective light source produced by the illumination system of this embodiment through the fly's eye lens 6, shown in FIG. 4, has a small difference in intensity distribution between that in the X direction and in the Y direction, as compared with the effective light source of the FIG. 2 example. Thus, with the illumination system of this embodiment, there is a small difference in resolution of the image, formed on the wafer 15, between that in the X direction and in the Y direction.

Figure 5A:
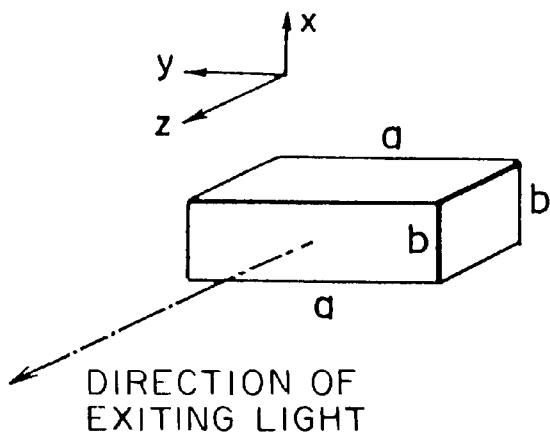
FIGS. 5A–5C are schematic views for explaining the structure of a small lens of the fly's eye lens of the illumination system of the FIG. 3 embodiment.
Figure 5B:
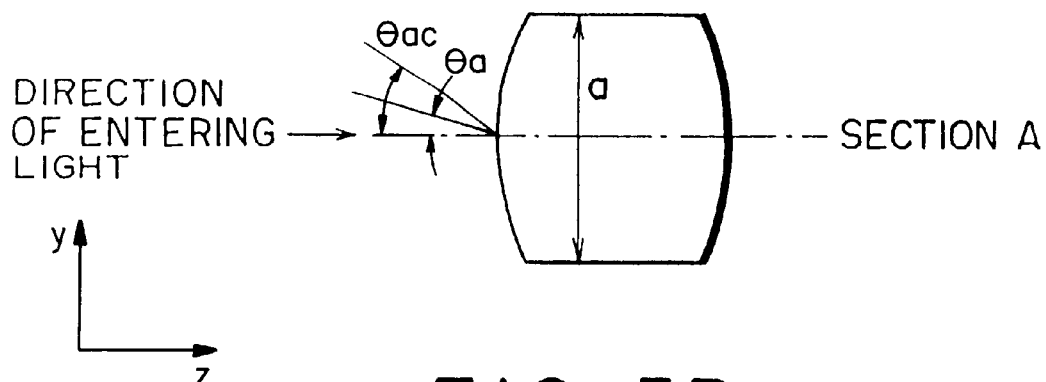
Figure 5C:
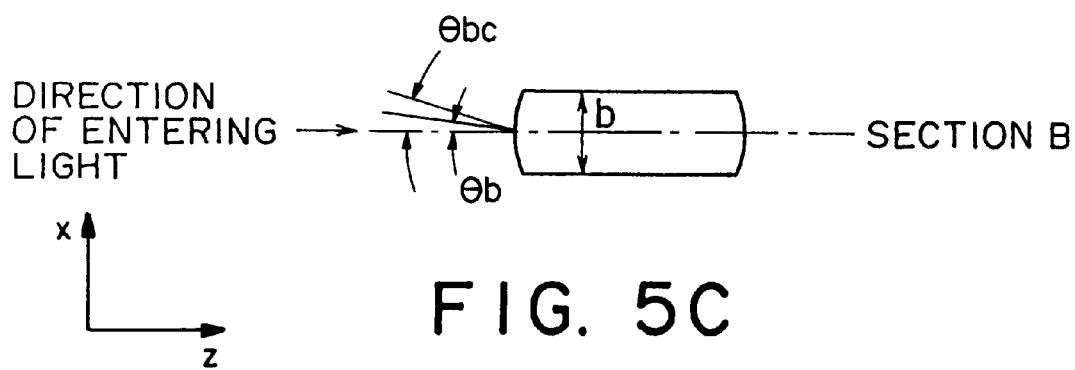

FIGS. 5A–5C are schematic views for explaining each small lens of the fly's eye lens of this embodiment. As shown in FIG. 5A, the small lens has an oblong sectional shape, its major side (longer side) having a length a and its minor side (shorter side) having a length b.

FIG. 5B illustrate the small lens in section A taken along a plane which is parallel to the longer side of the lens and which includes the optical axis. FIG. 5C illustrates the small lens in section B taken along a plane which is parallel to the shorter side of the lens and which contains the optical axis.

In the section A shown in FIG. 5B, the maximum angle defined between the optical axis and a light ray impinging on the small lens is θa. In the section B shown in FIG. 5C, the maximum angle defined between the optical axis and a light ray impinging on the small lens is θb. In the section A, the maximum angle defined between the optical axis and a light ray which can be transmitted by the small lens is θac. In the section B, the maximum angle defined between the optical axis and a light ray which can be transmitted by the small lens is θbc. Based on these assumptions, in the example of FIGS. 1 and 2, there is a relation:

$$\theta a = \theta b \approx \theta bc$$

$$\theta a = \theta b < \theta ac \qquad (1)$$

Thus, in section B a light ray of an angle close to the maximum angle θbc of light to be eclipsed is incident; whereas in section A a light ray of an angle smaller than the maximum angle θac of light to be eclipsed is incident. As a result, there occurs a difference in distribution of an effective light source between that in the X direction and in the Y direction.

In the embodiment of the present invention shown in FIGS. 3–5C, as compared therewith, there is a relation:

$$\theta a \approx \theta ac$$

$$\theta b \approx \theta bc \qquad (2)$$

Thus, the manner of distribution of an effective light source is even between that in the X direction and in the Y direction.

While a fly's eye lens and incident rays satisfying the relation of equation (2) assure a significantly advantageous result, a sufficient effect is attainable if the following relation is satisfied:

$$\theta a > \theta bc$$

$$\theta b \approx \theta bc \qquad (3)$$

That is, with this relation, a distribution of an effective light source becomes even between that in the X direction and in the Y direction and, thus, the difference in image quality, of the image formed on the wafer, between that in the X direction and in the Y direction is reduced. Further, eclipse of light is smaller and therefore higher illuminance is assured. Thus, the throughput of manufacture of semiconductor devices is improved.

While in this embodiment the light from the lamp 1 is divided into two, it may be divided into a desired number of lights, greater than two.

Figure 6:
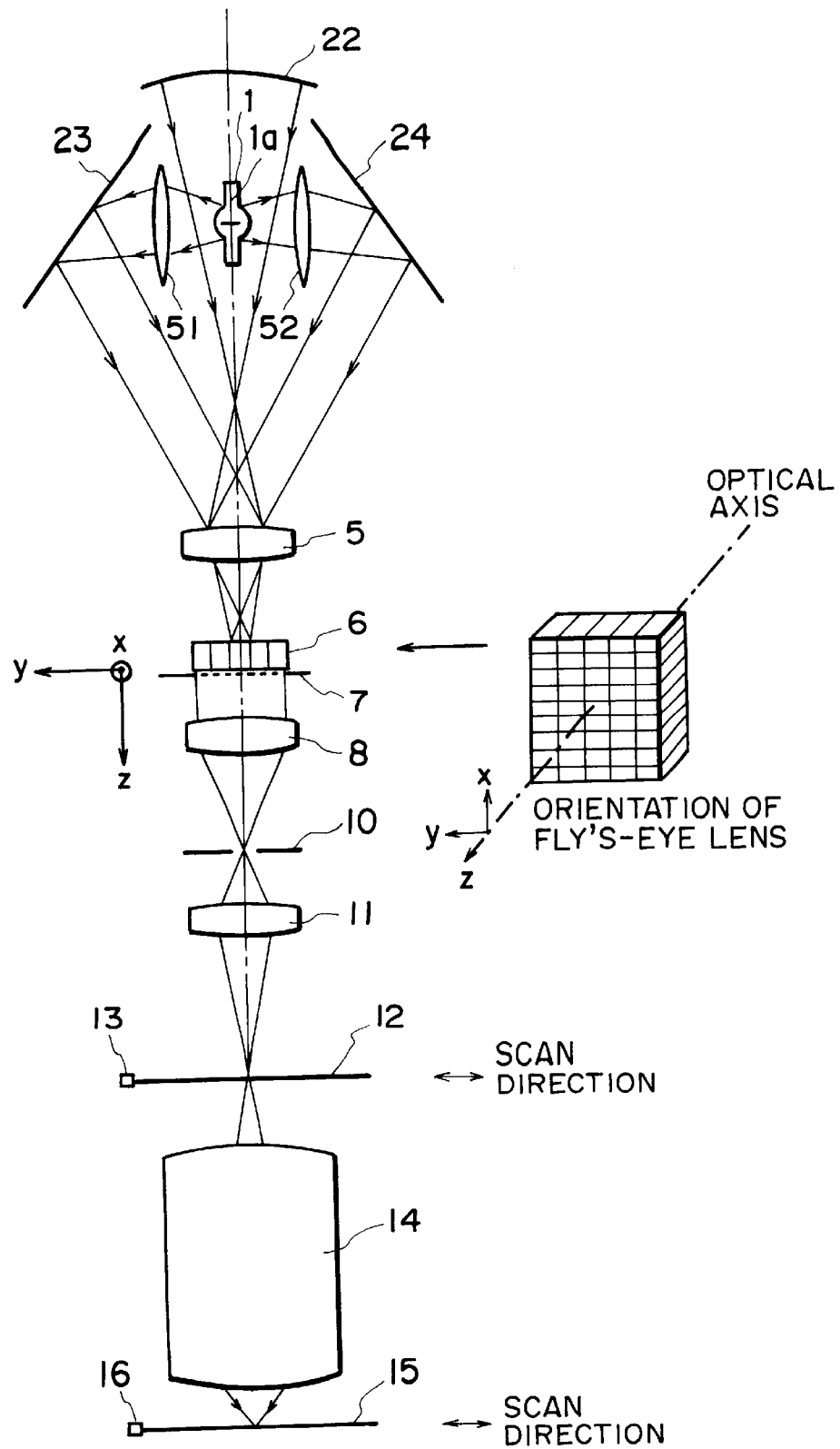
FIG. 6 is a schematic view of an illumination system according to a second embodiment of the present invention.

FIG. 6 is a schematic view of a second embodiment of the present invention, and it shows a scanning type projection exposure apparatus for the manufacture of devices such as semiconductor devices (e.g. ICs and LSIs), image pickup devices (e.g. CCDS), liquid crystal panels or magnetic heads, for example.

In FIG. 6, denoted at 1 is a light source comprising a Hg lamp or Xe-Hg lamp, for example, for producing ultraviolet light. Denoted at 1a is a light emitting portion (electrode) thereof. Disposed at left and right sides of the light source 1 are lenses 51 and 52 which serve to make parallel light rays emitted by the light emitting portion 1a leftwardly and rightwardly, respectively. The lights from the lenses 51 and 52 made parallel are reflected by flat mirrors 23 and 24, respectively, and they enter a condenser lens 5. These two lights are then projected on a fly's eye lens 6 along different directions.

Elliptical mirror 22 is provided so as to direct those rays to the condenser lens 5 which are not received by the lenses 51 and 52. This mirror may be omitted. The first focal point of the elliptical mirror 22 substantially coincides with the position of the light emitting portion 1a of the light source 1, and the light emitted upwardly from the light source 1 is reflected by this mirror toward the condenser lens 5. The provision of the elliptical mirror 22 serves to define an additional (third) light, thus a total of three lights are incident on the fly's eye lens 6 all in different directions.

Denoted at 7 is an ordinary aperture stop. It may be replaced by a special stop for ring-like zone illumination or quadruple illumination.

Also in this embodiment, a reticle 12 is illuminated with slit-like light of oblong sectional shape and an illumination region of oblong shape is defined on the reticle 12. Thus, each small lens of the fly's eye lens 6 has an oblong sectional shape which is analogous to the shape of the illumination region, as shown in FIG. 6. Usually a fly's eye lens comprises a combination of spherical lenses. However, it may comprise a combination of cylindrical lenses or toric lenses.

Denoted at 8 and 11 are condenser lenses, and denoted at 10 is a masking blade means. The reticle 12 is placed at a position optically conjugate with the masking blade means 10. Denoted at 14 is a projection optical system which comprises a dioptric system or cata-dioptric system, for example. Denoted at 15 is a wafer, the reticle 12 and the wafer 15 being placed in an optically conjugate relationship with each other with respect to the projection optical system. Denoted at 13 and 16 are driving devices for moving the reticle 12 and the wafer 15, respectively, in the scanning direction as depicted by arrows. The reticle 12 and the wafer 15 are scanned with slit-like light, while being moved by the driving devices 13 and 16, respectively.

In this embodiment, like the preceding embodiment, the direction of array of plural lights obtained by dividing the light, corresponds to the direction of the major side (longer side) of each small lens of the fly's eye lens 6, having an oblong sectional shape.

Thus, the illumination system of this embodiment assures substantially the same advantageous results as these of the preceding embodiment: even distribution of an effective light source in the X and Y directions as well as reduced difference in image quality of an image formed on the wafer 15 in the X and Y directions.

While in this embodiment the light from a light source is divided into two, it may be divided into a desired number of lights.

Figure 7:
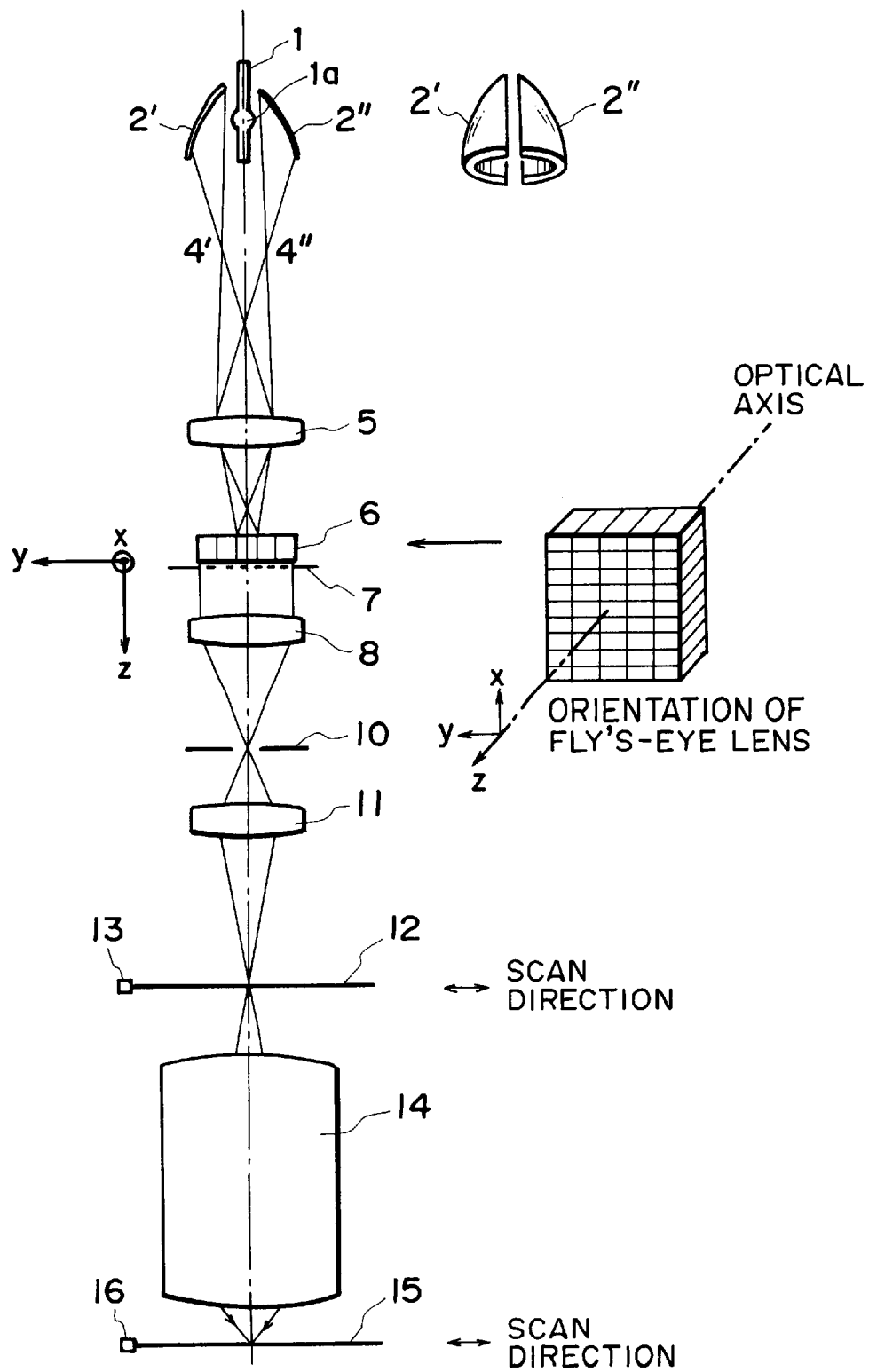
FIG. 7 is a schematic view of an illumination system according to a third embodiment of the present invention.

FIG. 7 is a schematic view of a third embodiment of the present invention, and it shows a scanning type projection exposure apparatus for the manufacture of devices such as semiconductor devices (e.g. ICs and LSIs), image pickup devices (e.g. CCDs), liquid crystal panels or magnetic heads, for example.

In FIG. 7, denoted at 1 is a light source such as a Hg lamp or Xe-Hg lamp, for example, for producing ultraviolet rays. Denoted at 1a is a light emitting portion (electrode) thereof. Denoted at 2' and 2" are portions of a single elliptical mirror, being divided into two. A second focal point of the elliptical mirror 2' is denoted at 4', and a second focal point of the other elliptical mirror 2" is denoted at 4". With the provision of mirrors divided from a single elliptical mirror, the light from the light source is substantively divided, and images of the light emitting portion 1a are formed at the second focal points 4' and 4", respectively. The lights from the images of the light emitting portion 1a formed at the second focal points 4' and 4", are collected by a condenser lens 5 onto the light entrance surface of a fly's eye lens 6.

Denoted at 7 is an ordinary aperture stop. It may be replaced by a special stop for ring-like zone illumination or quadruple illumination.

Also in this embodiment, a reticle 12 is illuminated with slit-like light of oblong sectional shape and an illumination region of oblong shape is defined on the reticle 12. Thus, each small lens of the fly's eye lens 6 has an oblong sectional shape which is analogous to the shape of the illumination region, as shown in FIG. 7. Usually a fly's eye lens comprises a combination of spherical lenses. However, it may comprise a combination of cylindrical lenses or toric lenses.

Denoted at 8 and 11 are condenser lenses, and denoted at 10 is a masking blade means. The reticle 12 is placed at a position optically conjugate with the masking blade means 10. Denoted at 14 is a projection optical system which comprises a dioptric system or cata-dioptric system, for example. Denoted at 15 is a wafer, the reticle 12 and the wafer 15 being placed in an optically conjugate relationship with each other with respect to the projection optical system 14. Denoted at 13 and 16 are driving devices for moving the reticle 12 and the wafer 15, respectively, in the scanning direction as depicted by arrows. The reticle 12 and the wafer 15 are scanned with slit-like light, while being moved by the driving devices 13 and 16, respectively.

In this embodiment, like the preceding embodiment, the direction of array of plural lights obtained by dividing the light (i.e., the direction of array of second focal points 4' and 4"), corresponds to the direction of a major side (longer side) of each small lens of the fly's eye lens 6, having an oblong sectional shape.

Thus, the illumination system of this embodiment also assures substantially the same advantageous results as those of the preceding embodiment: even distribution of an effective light source between that in the X direction and in the Y directions as well as reduced difference in image quality of an image formed on the wafer 15 in the X and Y directions.

Further, because of reduced eclipse of light, higher illuminance is attainable, thus improving the throughput of in the manufacture of semiconductor devices.

While in this embodiment the light from a light source is divided into two, it may be divided into a desired number of lights greater than two.

Figure 8:
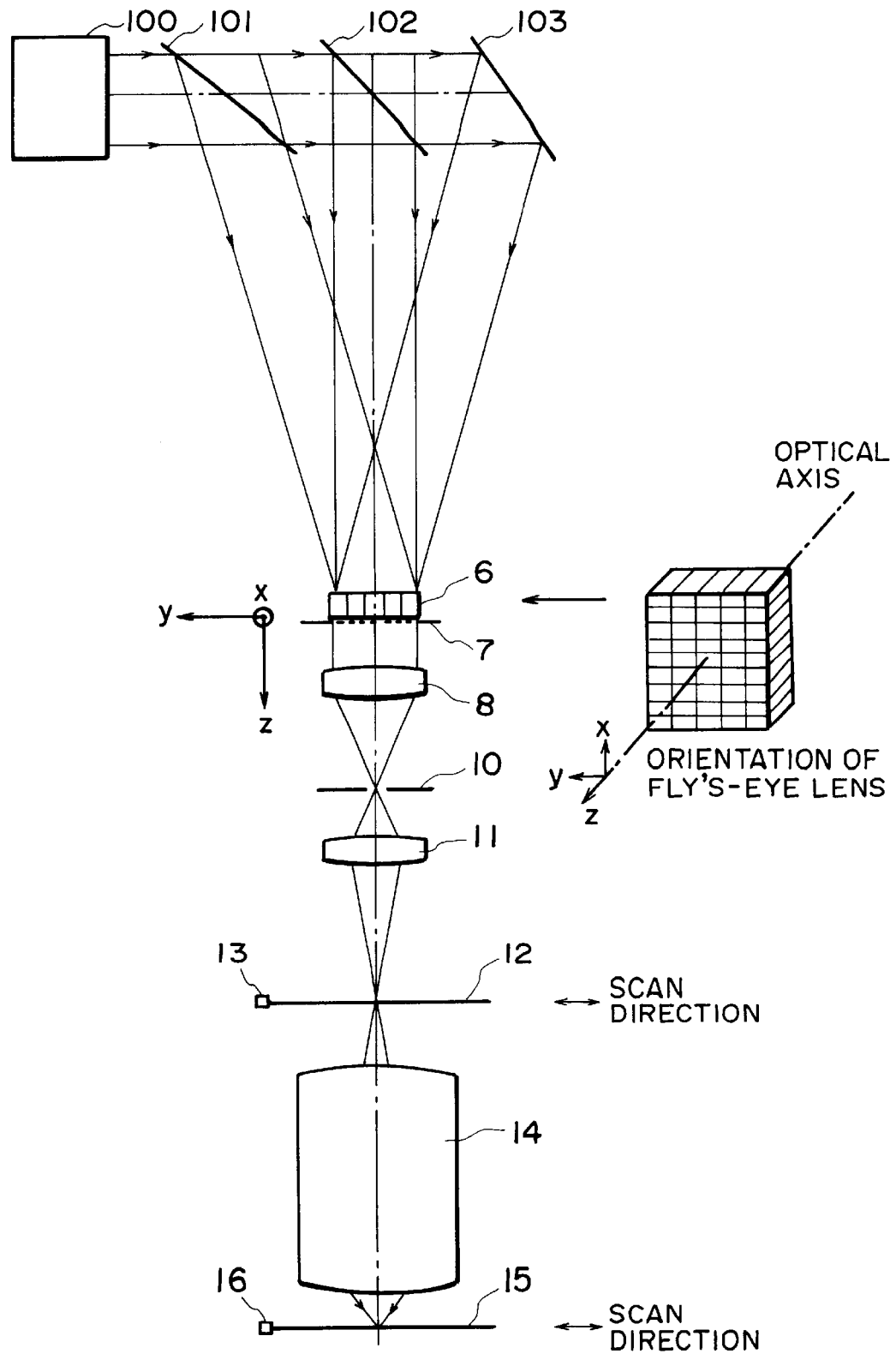
FIG. 8 is a schematic view of an illumination system according to a fourth embodiment of the present invention.

FIG. 8 is a schematic view of a fourth embodiment of the present invention, and it shows a scanning type projection exposure apparatus for the manufacture of devices such as semiconductor devices (e.g. ICs and LSIs), image pickup devices (e.g. CCDs), liquid crystal panels or magnetic heads, for example.

In FIG. 8, denoted at 100 is a laser light source such as an excimer laser, for example. Denoted at 101 and 102 are half mirrors, and denoted at 103 is a mirror. These mirrors serve to trisect laser light from the laser light source 100, and three laser lights are incident on a fly's eye lens 6.

Also in this embodiment, a reticle 12 is illuminated with slit-like light of oblong sectional shape and an illumination region of oblong shape is defined on the reticle 12. Thus, each small lens of the fly's eye lens 6 has an oblong sectional shape which is analogous to the shape of the illumination region, as shown in FIG. 8. Usually a fly's eye lens comprises a combination of spherical lenses. However, it may comprise a combination of cylindrical lenses or toric lenses.

Denoted at 8 and 11 are condenser lenses, and denoted at 10 is a masking blade means. The reticle 12 is placed at a position optically conjugate with the masking blade means 10. Denoted at 14 is a projection optical system which comprises a dioptric system or cata-dioptric system, for example. Denoted at 15 is a wafer, the reticle 12 and the wafer 15 being placed in an optically conjugate relationship with each other with respect to the projection optical system 14. Denoted at 13 and 16 are driving devices for moving the reticle 12 and the wafer 15, respectively, in the scanning direction as depicted by arrows. The reticle 12 and the wafer 15 are scanned with slit-like light, while being moved by the driving devices 13 and 16, respectively.

In this embodiment, like the preceding embodiment, the direction of array of plural lights obtained by dividing the light, corresponds to the direction of a major side (longer side) of each small lens of the fly's eye lens 6, having an oblong sectional shape.

Thus, the illumination system of this embodiment also assures substantially the same advantageous results as above of the preceding embodiment: even distribution of an effective light source between that in the X direction and in the Y directions as well as reduced difference in image quality of an image formed on the wafer 15 in the X and Y directions.

While in this embodiment the light from a light source is divided into three, it may be divided into a desired number of lights greater than three.

In accordance with the embodiments described above and applied to a projection exposure apparatus wherein an illumination range of substantially oblong shape is defined by using a fly's eye lens comprising a plurality of small lenses of oblong shape, the fly's eye lens is illuminated with lights arrayed along the major side (longer side) of the lens. This effectively assures an even distribution of an effective light source between in a longitudinal direction and in a transverse direction, thus avoiding or minimizing a difference in image performance of a reticle pattern between that in the longitudinal direction and in the transverse direction.

Further, because of reduced eclipse of light, higher illuminance is attainable, thus improving the throughput of in the manufacture of semiconductor devices. This is particularly effective when modified illumination such as ring-like zone illumination or quadruple illumination is employed.

Figure 9:
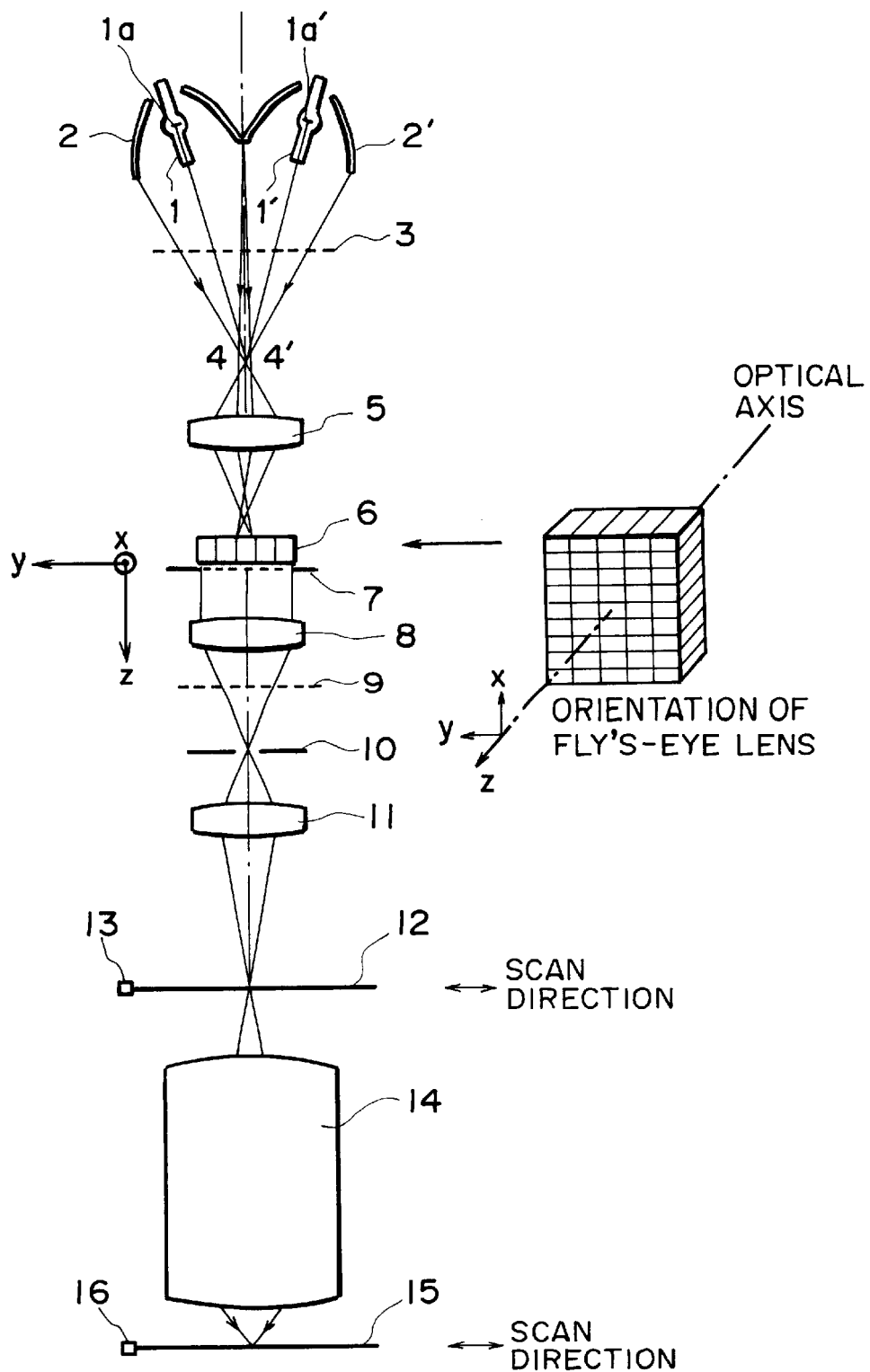
FIG. 9 is a schematic view of an illumination system according to a fifth embodiment of the present invention.

FIG. 9 is a schematic view of a fifth embodiment of the present invention, and it shows a scanning type projection exposure apparatus for the manufacture of devices such as semiconductor devices (e.g. ICs and LSIs), image pickup devices (e.g. CCDs), liquid crystal panels or magnetic heads, for example.

In FIG. 9, for simplicity of illustration, a deflecting mirror and a cold mirror such as shown in FIG. 1 are not illustrated, but they may be disposed at the positions depicted by broken lines, respectively.

Figure 11:
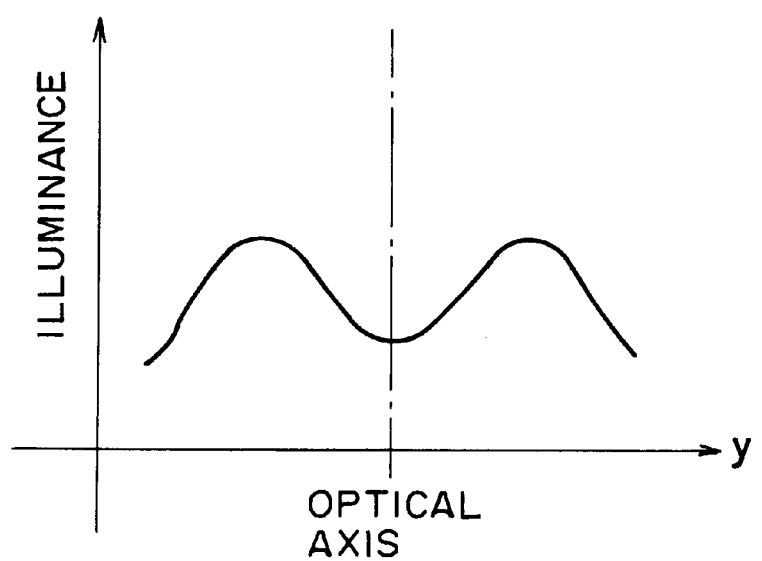
FIG. 11 is a graph for explaining a light intensity distribution in the vicinity of a second focal point position of an elliptical mirror of the illumination system of the FIG. 9 embodiment.

In FIG. 9, denoted at 1 is a light source such as a Hg lamp or Xe-Hg lamp, for example, for producing ultraviolet rays. Denoted at 1a is a light emitting portion (electrode) thereof. Denoted at 2 is an elliptical mirror. The light emitting portion 1a of the light source 1 is disposed in the vicinity of the first focal point of the mirror 2. The elliptical mirror 2 serves to image the light emitting portion 1a on its second focal point 4. Beside the light source 1 and the elliptical mirror 2, a similar light source 1' and a similar elliptical mirror 2' are disposed. Denoted at 1a' is a light emitting portion (electrode) of the light source 1'. The light emitting portion 1a' of the light source 1' is disposed in the vicinity of the first focal point of the elliptical mirror 2', and the elliptical mirror 2' serves to image the light emitting portion 1a on its second focal point 4'. These second focal points 4 and 4' are defined at positions symmetrical with each other with respect to the optical axis, in the sheet of the drawing of FIG. 9. FIG. 11 illustrates a light intensity distribution in the vicinity of the second focal points 4 and 4'.

Light from the image of the light emitting portion 1a formed at the second focal point 3 as well as light from the image of the light emitting portion 1a' formed at the second focal point 4', are collected by a condenser lens 5 onto the light entrance surface of an optical integrator which comprises a fly's eye lens 6. On this light entrance surface, the light emitting portions 1a and 1a' are re-imaged. Denoted at 7 is an aperture stop.

In this embodiment, a reticle 12 is illuminated with slit-like light having an oblong sectional shape, and an illumination region of oblong shape is defined on the reticle 12. Thus, each small lens of the fly's eye lens 6 has an oblong sectional shape which is analogous to the shape of the illumination region.

Denoted at 8 and 11 are condenser lenses, and denoted at 10 is a masking blade means (field stop). The reticle 12 is placed at a position optically conjugate with the masking blade means 10. Denoted at 14 is a projection optical system which comprises a dioptric system or cata-dioptric system, for example. Denoted at 15 is a wafer, the reticle 12 and the wafer 15 being placed in an optically conjugate relationship with each other with respect to the projection optical system 14. Denoted at 13 and 16 are driving devices for moving the reticle and the wafer 15, respectively, in the scanning direction as depicted by arrows. The reticle 12 and the wafer 15 are scanned with slit-like light, while being moved by the driving devices 13 and 16, respectively.

In this embodiment, the illumination system is so arranged that the light emitting portions 1a and 1a' are arrayed at the second focal points 4 and 4', along the major side (longer side) of the sectional shape of each small lens of the fly's eye lens 6. Thus, in the light intensity distribution in the vicinity of the second focal points 4 and 4', the intensity is low at the central portion and is high at the peripheral portion (it has two peaks). Since two lights are projected on the fly's eye lens in different directions, the intensity distribution of an effective light source as produced by the fly's eye lens 6 is such as shown in FIG. 10, wherein a pair of light sources are defined by each small lens.

From FIG. 9, the relationship between the direction of array of an the elliptical mirrors 2 and 2' and the direction of a longer side of the sectional shape of the small lens of the fly's eye lens 6 is clear.

Figure 10:
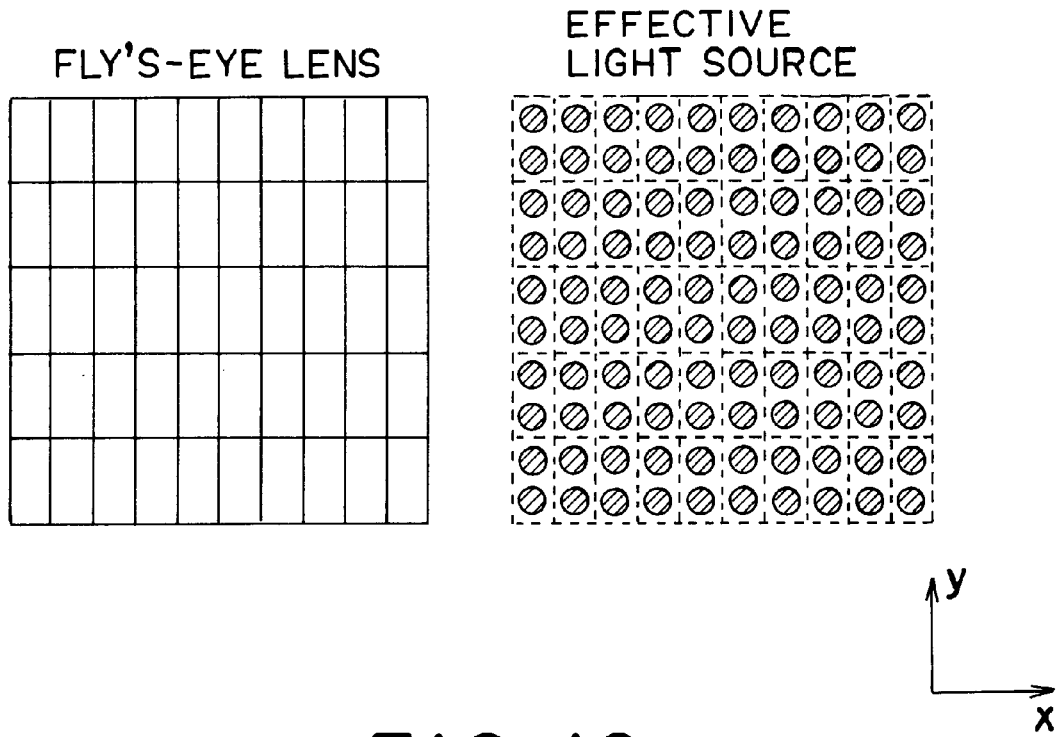
FIG. 10 is a schematic view for explaining a fly's eye lens and a light intensity distribution of an effective light source of the illumination system of the FIG. 9 embodiment.

The effective light source produced by the illumination system of this embodiment through the fly's eye lens 6, shown in FIG. 10, has a small difference in illuminance distribution between that in the X direction and in the Y direction, as compared with the effective light source of the FIG. 2 example. Thus, with the illumination system of this embodiment, there is a small difference in resolution of the image, formed on the wafer 15, between that in the X direction and in the Y direction.

Further, the use of two lamps assures higher illuminance, by which the throughput of in the manufacture of semiconductor devices can be improved.

While this embodiment uses two lamps and two elliptical mirrors, three or more sets of lamps and elliptical mirrors may be used.

Figure 12:
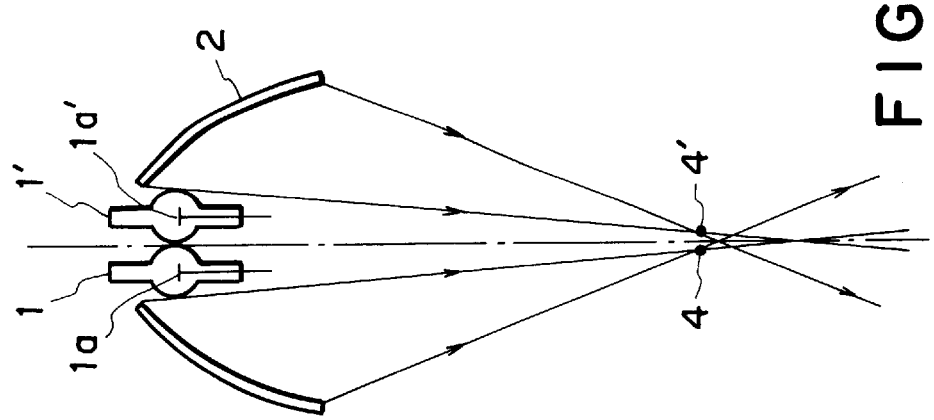
FIG. 12 is a fragmentary schematic view of an illumination system according to a sixth embodiment of the present invention.

FIG. 12 is a fragmentary schematic view of a sixth embodiment of the present invention. Except for the lamp and elliptical mirror arrangement, the structure and arrangement of this embodiment is essentially the same as that of the FIG. 9 embodiment. Thus, only the lamp and elliptical mirror arrangement is illustrated in FIG. 12. In this embodiment, two lamps 1 and 1' are mounted on a single elliptical mirror 2: two light emitting portions 1a and 1a' are imaged in the vicinity of the second focal point 4 (4') of the elliptical mirror 2. Thus, like the preceding embodiment, in the vicinity of the second focal point 4 (4'), a light intensity distribution such as shown in FIG. 11 is produced. The relationship between the the direction of array of the light emitting portions 1a and 1a' and the orientation of a longer side of each small lens of the fly's eye lens 6, is the same as in the preceding embodiment. Thus, the present embodiment assures essentially the same advantageous results as these of the preceding embodiment.

Since this embodiment uses only one elliptical mirror, there is an advantage of a simpler structure.

While two lamps are used in this embodiment, three or more lamps may be used.

Figure 13:
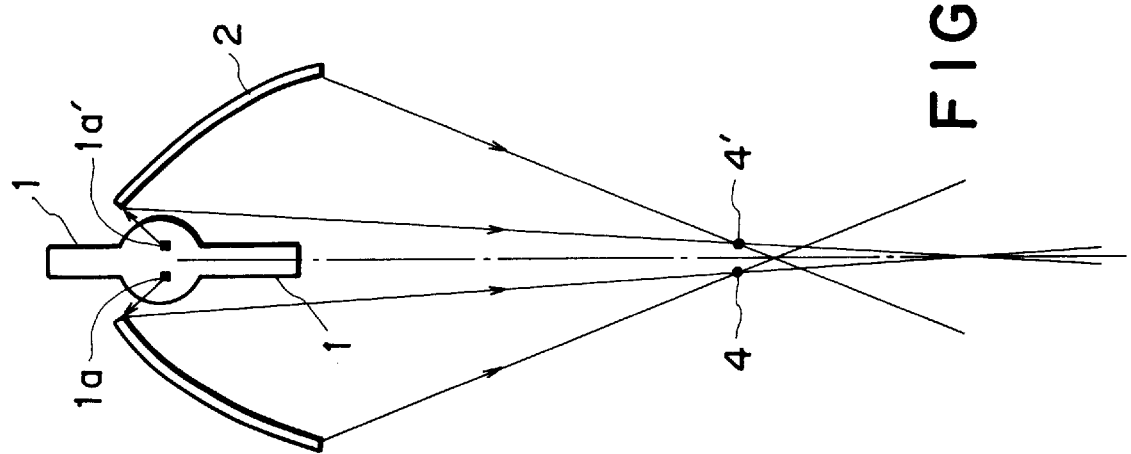
FIG. 13 is a fragmentary schematic view of an illumination system according to a seventh embodiment of the present invention.

FIG. 13 is a fragmentary schematic view of a seventh embodiment of the present invention. Except for the lamp and elliptical mirror arrangement, the structure and arrangement of this embodiment is essentially the same as that of the FIG. 9 embodiment. Thus, only the lamp and elliptical mirror arrangement is illustrated in FIG. 13. In this embodiment, a lamp 1 having two light emitting portions 1a and 1a' is mounted on one elliptical mirror 2: the two light emitting portions 1a and 1a' are imaged in the vicinity of the second focal point 4 (4') of the elliptical mirror 2. Thus, like the preceding embodiment, in the vicinity of the second focal point 4 (4'), a light intensity distribution such as shown in FIG. 11 is produced. The relationship between the the direction of array of the light emitting portions 1a and 1a' and the orientation of a longer side of each small lens of the fly's eye lens 6 is the same as in the preceding embodiment. Thus, the present embodiment assures essentially the same advantageous results as those of the preceding embodiment.

Since this embodiment uses only one lamp and only one elliptical mirror, there is an advantage of a simpler structure.

In accordance with the fifth to seventh embodiments described above and applied to a scanning type projection exposure apparatus wherein an illumination range of substantially oblong shape is defined by using a fly's eye lens comprising a plurality of small lenses of oblong shape, the fly's eye lens is illuminated with plural light images arrayed along the major side (longer side) of the lens. This effectively assures an even distribution of an effective light source between that in a longitudinal direction and in a transverse direction, thus avoiding or minimizing a difference in image performance of a reticle pattern between that in the longitudinal direction and in the transverse direction.

Further, because of reduced eclipse of light, higher illuminance is attainable, thus improving the throughput of in the manufacture of semiconductor devices. This is particularly effective when modified illumination such as ring-like zone illumination or quadruple illumination is employed.

Next, an embodiment of a semiconductor device manufacturing method using a scanning type projection exposure apparatus according to any one of the embodiments of FIGS. 3—13 will be explained.

FIG. 14 is a flow chart of the sequence of manufacturing a semiconductor device such as a semiconductor chip (e.g. an IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 15:
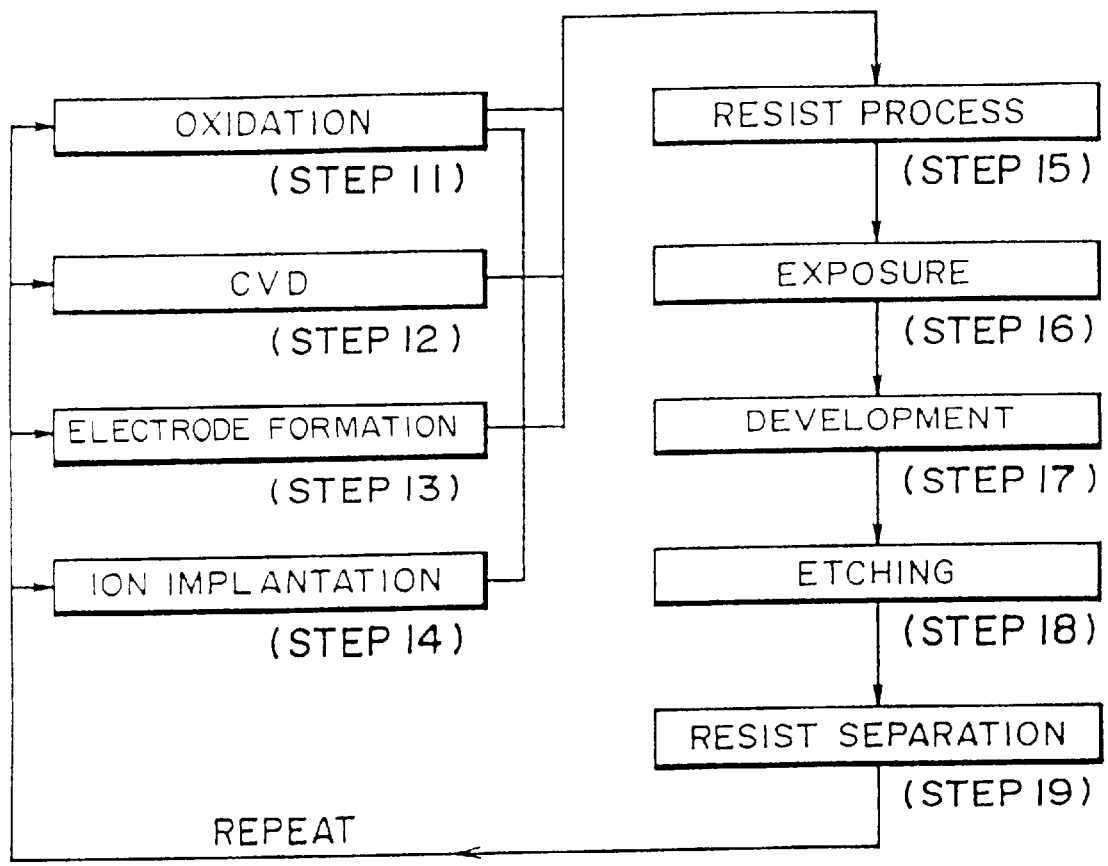
FIG. 15 is a flow chart of a wafer process.

FIG. 15 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An illumination system, comprising:

a fly's eye lens comprising lens elements each having an approximately oblong shape in section perpendicular to an optical axis of said illumination system, the oblong shape having a longer side and a shorter side; and an optical system for separating light from a light source into plural lights and for directing the plural lights toward said fly's eye lens along different directions, said optical system being arranged so that paths of the plural lights are juxtaposed along a lengthwise direction of the oblong shapes, wherein the following conditions are satisfied:

$\Theta a > \Theta bc$; and $\Theta b \approx \Theta bc$, in which a section A is taken along a plane parallel to the longer side of the lens elements and which includes the optical axis and a section B is taken along a plane parallel to the shorter side of the lens elements and which includes the optical axis, and in which in section A, a maximum angle defined between the optical axis and a light ray impinging on the lens elements is $\Theta a$, in section B, a maximum angle defined between the optical axis and a light ray impinging on the lens elements is $\Theta b$, in section A, the maximum angle defined between the optical axis and a light ray which can be transmitted by the lens elements is $\Theta ac$, and in section B, the maximum angle defined between the optical axis and a light ray which can be transmitted by the lens elements is $\Theta bc$.

2. A system according to claim 1, wherein said optical system comprises a spherical mirror having a curvature center, wherein the curvature center and the light source are disposed with eccentricity with respect to a direction perpendicular to the optical axis, such that said spherical mirror forms an image of the light source in the vicinity of the light source, and wherein the plural lights include light directed from the light source image to said fly's eye lens and light directed from the light source to said fly's eye lens.

3. A system according to claim 1, wherein the light source emits first and second lights in different directions and said optical system comprises first and second reflection mirrors for reflecting the first and second lights respectively, toward said fly's eye lens.

4. A system according to claim 3, wherein each of said first and second reflection mirrors comprises a flat mirror.

5. A system according to claim 3, wherein each of said first and second reflection mirrors comprises an elliptical mirror.

6. A system according to claim 1, wherein said optical system comprises a light divider for dividing light from the light source.

7. A system according to claim 6, wherein the light source comprises a laser.

8. A system according to claim 7, wherein the light source comprises an excimer laser.

9. A system according to claim 1, wherein said fly's eye lens defines a secondary light source, and said illumination system further comprises a condenser lens for illuminating a surface, to be illuminated, with light from said secondary light source.

10. An illumination system, comprising:

a light source having plural high luminance portions juxtaposed in a direction perpendicular to an optical axis of said illumination system;

a fly's eye lens comprising lens elements each having an approximately oblong shape in section perpendicular to the optical axis, the oblong shape having a longer side and a shorter side; and a common optical system for the plural high luminance portions of said light source, for directing lights from said plural high luminance portions toward said fly's eye lens along different directions, said common optical system being arranged so that paths of the lights are juxtaposed along a lengthwise direction of the oblong shapes, wherein the following conditions are satisfied:

$\Theta a > \Theta bc$; and $\Theta b \approx \Theta bc$, in which a section A is taken along a plane parallel to the longer side of the lens elements and which includes the optical axis and a section B is taken along a plane parallel to the shorter side of the lens elements and which includes the optical axis, and in which in section A, a maximum angle defined between the optical axis and a light ray impinging on the lens elements is $\Theta a$, in section B, a maximum angle defined between the optical axis and a light ray impinging on the lens elements is $\Theta b$, in section A, the maximum angle defined between the optical axis and a light ray which can be transmitted by the lens elements is $\Theta ac$, and in section B, the maximum angle defined between the optical axis and a light ray which can be transmitted by the lens elements is $\Theta bc$.

11. A system according to claim 10, wherein said common optical system comprises a single concave mirror for reflecting lights, from the plural high luminance portions, toward said fly's eye lens.

12. A system according to claim 11, wherein said concave mirror comprises an elliptical mirror.

13. A system according to claim 10, wherein said fly's eye lens defines a secondary light source, and said illumination system further comprises a condenser lens for illuminating a surface, to be illuminated, with light from said secondary light source.

14. An illumination system, comprising:

a plurality of light sources juxtaposed in a direction perpendicular to an optical axis of said illumination system;

a fly's eye lens comprising lens elements each having an approximately oblong shape in section perpendicular to the optical axis, the oblong shape having a longer side and a shorter side; and a common optical system for said light sources, for directing lights from said light sources toward said fly's eye lens along different directions, said common optical system being arranged so that paths of the lights are juxtaposed along a lengthwise direction of the oblong shapes, wherein the following conditions are satisfied:

$\Theta a > \Theta bc$; and $\Theta b \approx \Theta bc$, in which a section A is taken along a plane parallel to the longer side of the lens elements and which includes the optical axis and a section B is taken along a plane parallel to the shorter side of the lens elements and which includes the optical axis, and in which in section A, a maximum angle defined between the optical axis and a light ray impinging on the lens elements is $\Theta a$, in section B, a maximum angle defined between the optical axis and a light ray impinging on the lens elements is $\Theta b$, in section A, the maximum angle defined between the optical axis and a light ray which can be transmitted by the lens elements is $\Theta ac$, and in section B, the maximum angle defined between the optical axis and a light ray which can be transmitted by the lens elements is $\Theta bc$.

15. A system according to claim 14, wherein said common optical system comprises a single concave mirror for reflecting lights, from said light sources, toward said fly's eye lens.

16. A system according to claim 15, wherein said concave mirror comprises an elliptical mirror.

17. A system according to claim 14, wherein said fly's eye lens defines a secondary light source, and said illumination system further comprises a condenser lens for illuminating a surface, to be illuminated, with light from said secondary light source.

18. An exposure apparatus, comprising:

a fly's eye lens comprising lens elements each having an approximately oblong shape in section perpendicular to an optical axis of said exposure apparatus, the oblong shape having a longer side and a shorter side;

a first optical system for separating light from a light source into plural lights and for directing the plural lights toward said fly's eye lens along different directions, said first optical system being arranged so that paths of the plural lights are juxtaposed along a lengthwise direction of the oblong shapes; and a second optical system for illuminating a mask with light from a secondary light source defined by said fly's eye lens, and for projecting a pattern of the mask to an article to be exposed, wherein the following conditions are satisfied:

$\Theta a > \Theta bc$; and $\Theta b \approx \Theta bc$, in which a section A is taken along a plane parallel to the longer side of the lens elements and which includes the optical axis and a section B is taken along a plane parallel to the shorter side of the lens elements and which includes the optical axis, and in which in section A, a maximum angle defined between the optical axis and a light ray impinging on the lens elements is $\Theta a$, in section B, a maximum angle defined between the optical axis and a light ray impinging on the lens elements is $\Theta b$, in section A, the maximum angle defined between the optical axis and a light ray which can be transmitted by the lens elements is $\Theta ac$, and in section B, the maximum angle defined between the optical axis and a light ray which can be transmitted by the lens elements is $\Theta bc$.

19. An apparatus according to claim 18, wherein said first optical system comprises a spherical mirror having a curvature center, wherein the curvature center and the light source are disposed with eccentricity with respect to a direction perpendicular to the optical axis, such that said spherical mirror forms an image of the light source in the vicinity of the light source, and wherein the plural lights include light directed from the light source image to said fly's eye lens and light directed from the light source to said fly's eye lens.

20. An apparatus according to claim 18, wherein the light source emits first and second lights in different directions and said first optical system comprises first and second reflection mirrors for reflecting the first and second lights, respectively, toward said fly's eye lens.

21. An apparatus according to claim 20, wherein each of said first and second reflection mirrors comprises a flat mirror.

22. An apparatus according to claim 20, wherein each of said first and second reflection mirrors comprises an elliptical mirror.

23. An apparatus according to claim 18, wherein said first optical system comprises a light divider for dividing light from the light source.

24. An apparatus according to claim 23, wherein the light source comprises a laser.

25. An apparatus according to claim 24, wherein the light source comprises an excimer laser.

26. An apparatus according to claim 18, further comprising means for scanningly moving the mask and the article to be exposed relative to said first and second optical systems in a direction perpendicular to the lengthwise direction.

27. An exposure apparatus, comprising:
a light source having plural high luminance portions juxtaposed in a direction perpendicular to an optical axis of said exposure apparatus;
a fly's eye lens comprising lens elements each having an approximately oblong shape in section perpendicular to the optical axis, the oblong shape having a longer side and a shorter side;
a first, common optical system for the plural high luminance portions of said light source, for directing lights from the plural high luminance portions toward said fly's eye lens along different directions, said common optical system being arranged so that paths of the lights are juxtaposed along a lengthwise direction of the oblong shape; and
a second optical system for illuminating a mask with light from a secondary light source defined by said fly's eye lens, and for projecting a pattern of the mask onto an article to be exposed,
wherein the following conditions are satisfied:

$\Theta a > \Theta bc$; and $\Theta b \approx \Theta bc$, in which a section A is taken along a plane parallel to the longer side of the lens elements and which includes the optical axis and a section B is taken along a plane parallel to the shorter side of the lens elements and which includes the optical axis, and in which in section A, a maximum angle defined between the optical axis and a light ray impinging on the lens elements is $\Theta a$, in section B, a maximum angle defined between the optical axis and a light ray impinging on the lens elements is $\Theta b$, in section A, the maximum angle defined between the optical axis and a light ray which can be transmitted by the lens elements is $\Theta ac$, and in section B, the maximum angle defined between the optical axis and a light ray which can be transmitted by the lens elements is $\Theta bc$.

28. An apparatus according to claim 27, wherein said first optical system comprises a single concave mirror for reflecting lights, from the plural high luminance portions, toward said fly's eye lens.

29. An apparatus according to claim 27, wherein said concave mirror comprises an elliptical mirror.

30. An apparatus according to claim 27, further comprising means for scanningly moving the mask and the article to be exposed relative to said first and second optical systems in a direction perpendicular to the lengthwise direction.

31. An exposure apparatus, comprising:
a plurality of light sources juxtaposed in a direction perpendicular to an optical axis of said exposure apparatus;
a fly's eye lens comprising lens elements each having an approximately oblong shape in section perpendicular to the optical axis, the oblong shape having a longer side and a shorter side;
a first, common optical system for said light sources, for directing lights from said light sources toward said fly's eye lens along different directions, said common optical system being arranged so that paths of the lights are juxtaposed along a lengthwise direction of the oblong shapes; and
a second optical system for illuminating a mask with light from a secondary light source defined by said fly's eye lens, and for projecting a pattern of the mask onto an article to be exposed,
wherein the following conditions are satisfied:

$\Theta a > \Theta bc$; and $\Theta b \approx \Theta bc$, in which a section A is taken along a plane parallel to the longer side of the lens elements and which includes the optical axis and a section B is taken along a plane parallel to the shorter side of the lens elements and which includes the optical axis, and in which in section A, a maximum angle defined between the optical axis and a light ray impinging on the lens elements is $\Theta a$, in section B, a maximum angle defined between the optical axis and a light ray impinging on the lens elements is $\Theta b$, in section A, the maximum angle defined between the optical axis and a light ray which can be transmitted by the lens elements is $\Theta ac$, and in section B, the maximum angle defined between the optical axis and a light ray which can be transmitted by the lens elements is $\Theta bc$.

32. An apparatus according to claim 31, wherein said first optical system comprises a single concave mirror for reflecting lights, from said light sources, toward said fly's eye lens.

33. An apparatus according to claim 32, wherein said concave mirror comprises an elliptical mirror.

34. An apparatus according to claim 31, further comprising means for scanningly moving the mask and the article to be exposed relative to said first and second optical systems in a direction perpendicular to the lengthwise direction.

35. A device manufacturing method, comprising:
transferring a device pattern of a mask onto a workpiece using an illumination system comprising:
a fly's eye lens comprising lens elements each having an approximately oblong shape in section perpendicular to an optical axis of said illumination system, the oblong shape having a longer side and a shorter side; and
an optical system for separating light from a light source into plural lights and for directing the plural lights toward said fly's eye lens along different directions, said optical system being arranged so that paths of the plural lights are juxtaposed along a lengthwise direction of the oblong shapes,
wherein the following conditions are satisfied:

$\Theta a > \Theta bc$; and $\Theta b \approx \Theta bc$, in which a section A is taken along a plane parallel to the longer side of the lens elements and which includes the optical axis and a section B is taken along a plane parallel to the shorter side of the lens elements and which includes the optical axis, and in which in section A, a maximum angle defined between the optical axis and a light ray impinging on the lens elements is Θa, in section B, a maximum angle defined between the optical axis and a light ray impinging on the lens elements is Θb, in section A, the maximum angle defined between the optical axis and a light ray which can be transmitted by the lens elements is Θac, and in section B, the maximum angle defined between the optical axis and a light ray which can be transmitted by the lens elements is Θbc.

36. A method according to claim 35, wherein said optical system comprises a spherical mirror having a curvature center, wherein the curvature center and the light source are disposed with eccentricity with respect to a direction perpendicular to the optical axis, such that said spherical mirror forms an image of the light source in the vicinity of the light source, and wherein the plural lights include light directed from the light source image to said fly's eye lens and light directed from the light source to said fly's eye lens.

37. A method according to claim 35, wherein the light source emits first and second lights in different directions and said optical system comprises first and second reflection mirrors for reflecting the first and second lights respectively, toward said fly's eye lens.

38. A method according to claim 37, wherein each of said first and second reflection mirrors comprises a flat mirror.

39. A method according to claim 37, wherein each of said first and second reflection mirrors comprises an elliptical mirror.

40. A method according to claim 35, wherein said optical system comprises a light divider for dividing light from the light source.

41. A method according to claim 40, wherein the light source comprises a laser.

42. A method according to claim 41, wherein the light source comprises an excimer laser.

43. A method according to claim 35, wherein said fly's eye lens defines a secondary light source, and said illumination system further comprises a condenser lens for illuminating a surface, to be illuminated, with light from said secondary light source.

44. A device manufacturing method, comprising:
transferring a device pattern of a mask onto a workpiece using an illumination system comprising:
a light source having plural high luminance portions juxtaposed in a direction perpendicular to an optical axis of said illumination system;
a fly's eye lens comprising lens elements each having an approximately oblong shape in section perpendicular to the optical axis, the oblong shape having a longer side and a shorter side; and
a common optical system for the plural high luminance portions of said light source, for directing lights from said plural high luminance portions toward said fly's eye lens along different directions, said common optical system being arranged so that paths of the lights are juxtaposed along a lengthwise direction of the oblong shapes,
wherein the following conditions are satisfied:

$\Theta a > \Theta bc$; and $\Theta b \approx \Theta bc$, in which a section A is taken along a plane parallel to the longer side of the lens elements and which includes the optical axis and a section B is taken along a plane parallel to the shorter side of the lens elements and which includes the optical axis, and in which in section A, a maximum angle defined between the optical axis and a light ray impinging on the lens elements is Θa, in section B, a maximum angle defined between the optical axis and a light ray impinging on the lens elements is Θb, in section A, the maximum angle defined between the optical axis and a light ray which can be transmitted by the lens elements is Θac, and in section B, the maximum angle defined between the optical axis and a light ray which can be transmitted by the lens elements is Θbc.

45. A method according to claim 44, wherein said common optical system comprises a single concave mirror for reflecting lights, from the plural high luminance portions, toward said fly's eye lens.

46. A method according to claim 45, wherein said concave mirror comprises an elliptical mirror.

47. A method according to claim 44, wherein said fly's eye lens defines a secondary light source, and said illumination system further comprises a condenser lens for illuminating a surface, to be illuminated, with light from said secondary light source.

48. A device manufacturing method comprising:
transferring a device pattern of a mask onto a workpiece using an illumination system comprising:
a plurality of light sources juxtaposed in a direction perpendicular to an optical axis of said illumination system;
a fly's eye lens comprising lens elements each having an approximately oblong shape in section perpendicular to the optical axis, the oblong shape having a longer side and a shorter side; and
a common optical system for said light sources, for directing lights from said light sources toward said fly's eye lens along different directions, said common optical system being arranged so that paths of the lights are juxtaposed along a lengthwise direction of the oblong shapes,
wherein the following conditions are satisfied:

$\Theta a > \Theta bc$; and $\Theta b \approx \Theta bc$, in which a section A is taken along a plane parallel to the longer side of the lens elements and which includes the optical axis and a section B is taken alone a plane parallel to the shorter side of the lens elements and which includes the optical axis, and in which in section A, a maximum angle defined between the optical axis and a light ray impinging on the lens elements is Θa, in section B, a maximum angle defined between the optical axis and a light ray impinging on the lens elements is Θb, in section A, the maximum angle defined between the optical axis and a light ray which can be transmitted by the lens elements is Θac, and in section B, the maximum angle defined between the optical axis and a light ray which can be transmitted by the lens elements is Θbc.

49. A method according to claim 48, wherein said common optical system comprises a single concave mirror for reflecting lights, from said light sources, toward said fly's eye lens.

50. A method according to claim 49, wherein said concave mirror comprises an elliptical mirror.

51. A method according to claim 48, wherein said fly's eye lens defines a secondary light source, and said illumination system further comprises a condenser lens for illuminating a surface, to be illuminated, with light from said secondary light source.

52. An illumination system, comprising:
   a fly's eye lens comprising lens elements each having an approximately oblong shape in section perpendicular to the optical axis of said illumination system, the oblong shape having a longer side and a shorter side; and
   directing means for directing plural lights toward said fly's eye lens along different directions, said directing means being arranged so that paths of the plural lights are juxtaposed along a lengthwise direction of the oblong shape,
   wherein the following conditions are satisfied:

Θa>Θbc; and

Θb≈Θbc, in which a section A is taken along a plane parallel to the longer side of the lens elements and which includes the optical axis and a section B is taken along a plane parallel to the shorter side of the lens elements and which includes the optical axis, and in which in section A, a maximum angle defined between the optical axis and a light ray impinging on the lens elements is Θa, in section B, a maximum angle defined between the optical axis and a light ray impinging on the lens elements is Θb, in section A, the maximum angle defined between the optical axis and a light ray which can be transmitted by the lens elements is Θac, and in section B, the maximum angle defined between the optical axis and a light ray which can be transmitted by the lens elements is Θbc.

53. An exposure apparatus, comprising:
   a fly's eye lens comprising lens elements each having an approximately oblong shape in section perpendicular to the optical axis of said exposure apparatus, the oblong shape having a longer side and a shorter side;
   directing means for directing plural lights toward said fly's eye lens along different directions, said directing means being arranged so that paths of the plural lights are juxtaposed along a lengthwise direction of the oblong shape; and
   an optical system for illuminating a mask with light from a secondary light source defined by said fly's eye lens, and for projecting a pattern of the mask to an article to be exposed,
   wherein the following conditions are satisfied:

Θa>Θbc; and

Θb≈Θbc, in which a section A is taken along a plane parallel to the longer side of the lens elements and which includes the optical axis and a section B is taken along a plane parallel to the shorter side of the lens elements and which includes the optical axis, and in which in section A, a maximum angle defined between the optical axis and a light ray impinging on the lens elements is Θa, in section B, a maximum angle defined between the optical axis and a light ray impinging on the lens elements is Θb, in section A, the maximum angle defined between the optical axis and a light ray which can be transmitted by the lens elements is Θac, and in section B, the maximum angle defined between the optical axis and a light ray which can be transmitted by the lens elements is Θbc.

54. A device manufacturing method, comprising the steps of:
   transferring a device pattern of a mask onto a workpiece using an illumination system which comprises (i) a fly's eye lens with lens elements each having an approximately oblong shape in section perpendicular to an optical axis of the illumination system, the oblong shape having a longer side and a shorter side, and (ii) directing means for directing plural lights toward the fly's eye lens along different directions, the directing means being arranged so that paths of the plural lights are juxtaposed along a lengthwise direction of the oblong shape,
   wherein the following conditions are satisfied:

Θa>Θbc; and

Θb≈Θbc, in which a section A is taken along a plane parallel to the longer side of the lens elements and which includes the optical axis and a section B is taken along a plane parallel to the shorter side of the lens elements and which includes the optical axis, and in which in section A, a maximum angle defined between the optical axis and a light ray impinging on the lens elements is Θa, in section B, a maximum angle defined between the optical axis and a light ray impinging on the lens elements is Θb, in section A, the maximum angle defined between the optical axis and a light ray which can be transmitted by the lens elements is Θac, and in section B, the maximum angle defined between the optical axis and a light ray which can be transmitted by the lens elements is Θbc.

55. An illumination system for illuminating a mask in an exposure apparatus, said system comprising:
   a fly's eye lens comprising lens elements each having an approximately oblong shape in section perpendicular to an optical axis of said illumination system, the oblong shape having a lengthwise direction; and
   an optical system for separating light from a light source into a plurality of light beams and for directing each of the plurality of light beams toward said fly's eye lens along different directions, said optical system being arranged so that each of the plurality of light beams are juxtaposed on a light exit surface of said lens elements along the lengthwise direction of the oblong shape of each of said lens elements.

56. An illumination system for illuminating a mask in an exposure apparatus, which scans the mask in a scan direction, said system comprising:
   a light source having plural high luminance portions juxtaposed in a direction perpendicular to an optical axis of said illumination system;
   a fly's eye lens comprising lens elements each having an approximately oblong shape in section perpendicular to the optical axis, the oblong shape having a lengthwise direction; and
   a common optical system for directing a plurality of light beams from said plural high luminance portions toward said fly's eye lens along different directions, said common optical system being arranged so that each of the plurality of light beams are juxtaposed on a light exit surface of said lens elements along the lengthwise direction of the oblong shape of each of said lens elements.

57. An illumination system for illuminating a mask in an exposure apparatus, said system comprising:
   a plurality of light sources juxtaposed in a direction perpendicular to an optical axis of said illumination system;

a fly's eye lens comprising lens elements each having an approximately oblong shape in section perpendicular to the optical axis, the oblong shape having a lengthwise direction; and a common optical system for directing a plurality of light beams from said light sources toward said fly's eye lens along different directions, said common optical system being arranged so that each of the plurality of light beams are juxtaposed on a light exit surface of said lens elements along the lengthwise direction of the oblong shape of each of said lens elements.

58. An exposure apparatus comprising:

an illumination system comprising:
 (i) a fly's eye lens comprising lens elements each having an approximately oblong shape in section perpendicular to an optical axis of said illumination system, the oblong shape having a lengthwise direction; and
 (ii) an optical system for separating light from a light source into a plurality of light beams and for directing each of the plurality of light beams toward said fly's eye lens along different directions, said optical system being arranged so that each of the plurality of light beams are juxtaposed on a light exit surface of said lens elements along the lengthwise direction of the oblong shape of each of said lens elements; and a projection optical system for projecting a pattern of the mask illuminated with said illumination system onto a substrate to be exposed.

59. An apparatus according to claim 58, wherein the mask and the substrate are scanned with illumination light from a fly's eye lens of said illumination system and the lengthwise direction is perpendicular to the direction of scan, whereby the entire pattern of the mask is projected onto a pattern region on the substrate.

60. An exposure apparatus comprising:

an illumination system comprising:
 (i) a light source having plural high luminance portions juxtaposed in a direction perpendicular to an optical axis of said illumination system;
 (ii) a fly's eye lens comprising lens elements each having an approximately oblong shape in section perpendicular to the optical axis, the oblong shape having a lengthwise direction; and
 (iii) a common optical system for directing a plurality of light beams from said plural high luminance portions toward said fly's eye lens along different directions, said common optical system being arranged so that each of the plurality of light beams are juxtaposed on a light exit surface of said lens elements along the lengthwise direction of the oblong shape of each of said lens elements; and a projection optical system for projecting a pattern of the mask illuminated with said illumination system onto a substrate to be exposed.

61. An apparatus according to claim 60, wherein the mask and the substrate are scanned with illumination light from a fly's eye lens of said illumination system and the lengthwise direction is perpendicular to the direction of scan, whereby the entire pattern of the mask is projected onto a pattern region on the substrate.

62. An exposure apparatus comprising:

an illumination system comprising:
 (i) a plurality of light sources juxtaposed in a direction perpendicular to an optical axis of said illumination system;
 (ii) a fly's eye lens comprising lens elements each having an approximately oblong shape in section perpendicular to the optical axis, the oblong shape having a lengthwise direction; and
 (iii) a common optical system for directing a plurality of light beams from said light sources toward said fly's eye lens along different directions, said common optical system being arranged so that each of the plurality of light beams are juxtaposed on a light exit surface of said lens elements along the lengthwise direction of the oblong shape of each of said lens elements; and a projection optical system for projecting a pattern of the mask illuminated with said illumination system onto a substrate to be exposed.

63. An apparatus according to claim 62, wherein the mask and the substrate are scanned with illumination light from a fly's eye lens of said illumination system and the lengthwise direction is perpendicular to the direction of scan, whereby the entire pattern of the mask is projected onto a pattern region on the substrate.

64. A device manufacturing method comprising a process of transferring a circuit pattern onto a wafer by use of an exposure apparatus as recited in any one of claims 58 through 63.

* * * * *

UNITED STATES PATENT AND TRADEMARK OFFICE
CERTIFICATE OF CORRECTION

PATENT NO. : 6,055,039
DATED : April 25, 2000
INVENTOR(S) : Shigeru Hayata

It is certified that error appears in the above-identified patent and that said Letters Patent is hereby corrected as shown below:

Column 5:
Line 26, "illustrate" should read -- illustrates -- .

Column 6:
Line 18, "lights, " should read -- lights -- .

Column 8:
Line 3, "directions" should read -- direction -- ;
Line 7, "of" should be deleted ;
Line 50, "above" should read -- those -- ;
Line 53, "directions" should read -- direction -- ; and
Line 66, "between" should read -- between that -- .

Column 9:
Line 4, "of" should be deleted; and
Line 64, "In." should read -- In -- .

Column 10:
Line 10, "an" should be deleted;
Line 23, "of" (first occurrence) should be deleted;
Line 44, "these" should read -- those -- ; and
Line 62, "the" (second occurrence) should be deleted.

Column 11:
Line 16, "of" should be deleted.

UNITED STATES PATENT AND TRADEMARK OFFICE
CERTIFICATE OF CORRECTION

PATENT NO. : 6,055,039
DATED : April 25, 2000
INVENTOR(S) : Shigeru Hayata

It is certified that error appears in the above-identified patent and that said Letters Patent is hereby corrected as shown below:

<u>Column 15, claim 27:</u>
Line 61, "claim 27," should read -- 28, --.

<u>Column 18:</u>
Line 48, "alone" should read -- along --.

Signed and Sealed this

Fourth Day of September, 2001

*Attest:*

*Attesting Officer*

NICHOLAS P. GODICI
*Acting Director of the United States Patent and Trademark Office*